United States Patent
Ilkov et al.

(10) Patent No.: US 8,909,162 B2
(45) Date of Patent: Dec. 9, 2014

(54) SYSTEM AND METHOD FOR TRANSMITTING A RADIO FREQUENCY SIGNAL THROUGH A SPEAKER COIL

(75) Inventors: Nikolay Ilkov, Munich (DE); Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 259 days.

(21) Appl. No.: 13/607,382

(22) Filed: Sep. 7, 2012

(65) Prior Publication Data

US 2014/0073271 A1  Mar. 13, 2014

(51) Int. Cl.
*H04B 1/38* (2006.01)
*H04B 1/44* (2006.01)

(52) U.S. Cl.
USPC ............................................. 455/73; 381/400

(58) Field of Classification Search
USPC ..................................... 455/73; 381/400–402
See application file for complete search history.

(56) References Cited

U.S. PATENT DOCUMENTS

| | | | |
|---|---|---|---|
| 2,812,393 A * | 11/1957 | Patrick | 330/273 |
| 3,112,446 A * | 11/1963 | Wilson | 455/86 |
| 6,762,645 B1 | 7/2004 | Grant | |
| 8,018,344 B2 | 9/2011 | Chang et al. | |
| 2007/0060221 A1 | 3/2007 | Burgan et al. | |
| 2011/0181395 A1 | 7/2011 | Kao et al. | |
| 2013/0052947 A1 | 2/2013 | Kole et al. | |

FOREIGN PATENT DOCUMENTS

| | | |
|---|---|---|
| CN | 101232124 A | 7/2008 |
| EP | 1 703 585 A2 | 9/2006 |
| JP | 10164685 A | 6/1998 |
| JP | 2000513159 A | 10/2000 |
| KR | 20080060113 A | 7/2008 |
| TW | I281340 B | 5/2007 |
| WO | WO 2007/032890 A1 | 3/2007 |
| WO | 2013159429 A1 | 10/2013 |

* cited by examiner

*Primary Examiner* — Lee Nguyen
(74) *Attorney, Agent, or Firm* — Slater & Matsil, L.L.P.

(57) ABSTRACT

In accordance with an embodiment, a system has an audio amplifier configured to be coupled to a speaker coil port via a parallel resonant circuit, and a radio frequency (RF) amplifier configured to transmit a RF signal at a first RF transmission frequency. The speaker coil port is configured to be coupled to a speaker coil, and the parallel resonant circuit has a resonance frequency of about the first RF transmission frequency.

28 Claims, 3 Drawing Sheets

SYSTEM AND METHOD FOR TRANSMITTING A RADIO FREQUENCY SIGNAL THROUGH A SPEAKER COIL

TECHNICAL FIELD

This invention relates generally to semiconductor circuits and methods, and more particularly to a system and method for a transmitting a radio frequency signal though a speaker coil.

BACKGROUND

Due to its electrical characteristics being similar to that of a ferrite rod antenna, a speaker coil may be used as an antenna for radio frequency (RF) transmission device, as well as an electromechanical driver for a loudspeaker at audio frequencies. In cost sensitive portable devices such as mobile phones, digital audio devices, headphones and hearing aids, RF functionality can be added along with acoustic functionality without taking up much extra physical space. For example, the addition of RF functionality to the speaker coil within a mobile phone may enable near field communications for financial transactions or for swapping data between users. For hearing aids, the addition of RF functionality may allow the hearing aid to be controlled or programmed remotely, and may enable a binaural pair of hearing aids to exchange data to improve the directionality of the audio signal using audio signal processing algorithms.

In some systems, a combined acoustic and RF transmission system may be implemented by coupling the audio and RF power amplifiers in parallel with the speaker coil. While the RF power amplifier may use AC coupling capacitors to prevent interference to the audio signal, such AC coupling with respect to the audio amplifier may present a capacitive impedance that reflects RF signals generated by the RF power amplifier. In some systems, such reflections may be dealt with by using lossy highpass and lowpass filter networks that may cause loss and attenuation to the audio signal. In some cases, these losses are due to losses in filter inductors used for RF frequencies in the range of 100 kHz up to 30 MHz. Inductors having a very small form factor, such as the ones typically used in portable devices, may be particularly lossy. In other systems, a RF amplifier and acoustic amplifier may be coupled to a speaker coil via a mechanical relay.

SUMMARY OF THE INVENTION

In accordance with an embodiment, a system has an audio amplifier configured to be coupled to a speaker coil port via a parallel resonant circuit, and a RF amplifier configured to transmit a RF signal at a first RF transmission frequency. The speaker coil port is configured to be coupled to a speaker coil, and the parallel resonant circuit has a resonance frequency of about the first RF transmission frequency.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a RF transmission system using a speaker coil. Embodiments of the present invention are not limited to systems using speaker coils, but may be applied to other types of circuits. Examples of other circuits include, but are not limited to wire line and wireless communications circuits, and circuits that utilize multiple transmit amplifiers and/or signal generators.

In an embodiment, an audio amplifier and a RF amplifier are coupled to a speaker coil using a low-loss matching network that may include one or more CMOS switches, inductors and capacitors. In some embodiments, the matching network may be adjustable and/or adaptable to compensate for changing RF environment in the vicinity of the speaker coil and/or to compensate for variations in manufacturing. As such, some embodiments may utilize tunable filters implemented using and inductor coupled to a switchable capacitor bank having a one or more capacitors switched by one or more high power transistors such as a RF CMOS transistor or other type of transistor. In some cases, efficient performance is maintained even if the power transistor has poor RF isolation or if the inductor has a relatively large series resistance compared to the resistance of the high power transistor or resistance of the and the capacitors.

Figure 1:
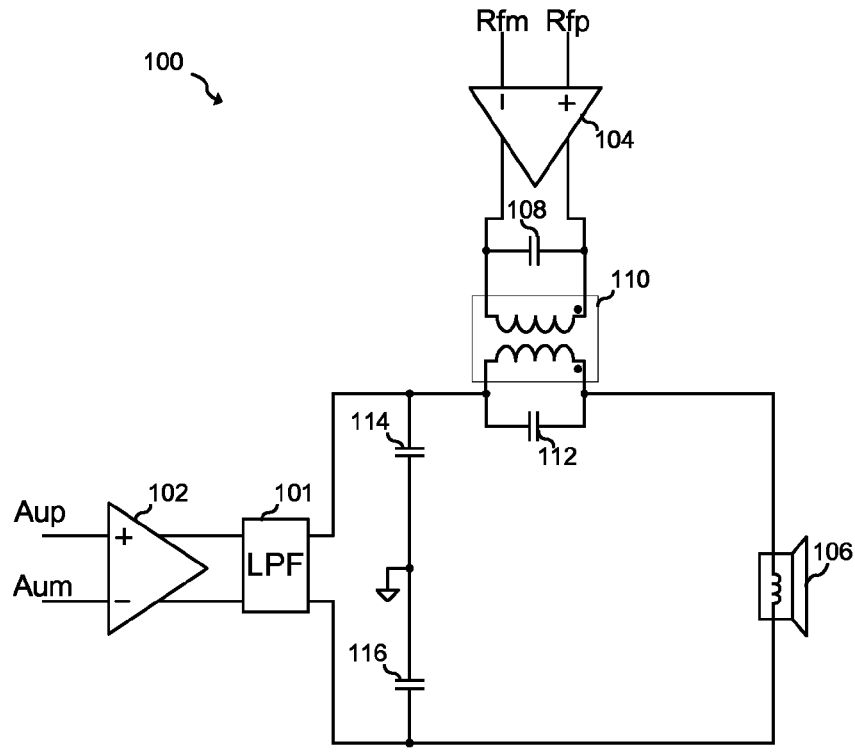
FIG. 1 illustrates a schematic of an embodiment system in which an RF amplifier is coupled to a loudspeaker via a magnetic transformer.

FIG. 1 illustrates embodiment acoustic and RF transmission system 100 that includes audio amplifier 102 coupled to speaker coil 106 via the secondary winding of transformer 110. RF amplifier 104 is further coupled to speaker coil 106 via transformer 110 such that the primary winding of transformer 110 is coupled to RF amplifier 104. In an embodiment, transformer 110 may be implemented as a current type transformer having a low impedance that is dimensioned for the sum of both RF and audio signal currents. The turns ratio of transformer may be dimensioned to provide a maximum power match between speaker coil 106 and RF power amplifier 104. Because transformer 110 provides AC isolation, additional decoupling for the RF power amplifier is required.

Capacitors 114 and 116 provide a low impedance path to ground for RF signals. In some embodiments, capacitors 114 and 116 may be implemented using existing parasitic capacitance of devices coupled to transformer 110 and/or additional capacitive components if necessary for proper bypassing of the RF signal generated by RF amplifier 104. Similarly, capacitors 108 and 112 represent the parasitic capacitance of the primary winding and secondary winding, respectively, of transformer 110 plus additional capacitive components that may be used to tune the transformer's parallel resonance frequency to be approximately the transmission frequency of the RF signal generated by RF amplifier 104. By operating transformer 110 in a parallel resonance mode, a smaller transformer may be used compared to those used for non-resonant operation. In some embodiments, transformer 110, RF amplifier 104, and audio amplifier 102 may be implemented on a same integrated circuit. Alternatively, these components, or combinations of these components may be implemented using a plurality of integrated circuits and/or board level components that are partitioned in various ways.

In an embodiment, transformer 110 may be configured to have a coupling factor of 0.98 or greater at low frequency. Alternatively, other coupling factors may be used according to the particular system and its specifications. In some embodiments, transformer 110 may have a 1:1 turns ratio between the primary and secondary sides of transformer 104. In some embodiments, transformer 110 may be implemented using a ferrite core transformer using, for example, from about five windings to about seven windings per side. Alternatively, other turns ratios and/or other transformer types may be used according to the specific embodiment and its specifications.

RF amplifier 104 may be configured to transmit a RF signal at frequencies between about 100 kHz and about 30 MHz, however frequencies outside of this range may be used. For example, in an embodiment where a 13 MHz transmission frequency is used, the parallel resonance due to the combination of capacitors 108 and 112 and the inductance of transformer 110 may also be tuned to the RF frequency of 13 MHz. In some embodiments, RF amplifier 104 may be implemented as a single ended amplifier that provides, for example, 100 mW or less power to speaker coil 106. RF amplifier 104 may alternatively provide more power than 100 mW and/or may be implemented as a differential amplifier.

In an embodiment, audio amplifier 102 may be implemented using a class D amplifier having a bridge type output stage that is driven, for example, by a pulse width modulated output stage (not shown). In some embodiments, a low pass filter 101 may be coupled between audio amplifier 102 and transformer 110 in order to filter the switching frequencies of the pulse width modulated signal driving audio amplifier 102. Low pass filter 101 may be used, for example, to filter radiated emissions in order to gain compliance with various governmental commission requirements. Alternatively, low pass filter 101 may be omitted.

Figure 2:
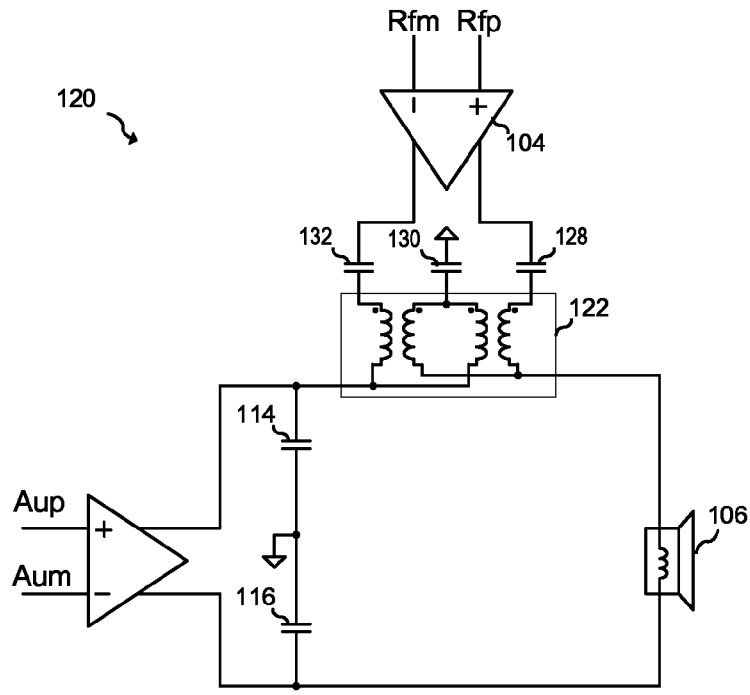
FIG. 2 illustrates a schematic of an embodiment system in which a RF amplifier is coupled to a loudspeaker via a balun transformer.

FIG. 2 illustrates system 120 according to another embodiment of the present invention. System 120 is similar to system 100 shown in FIG. 1, with the exception that the transformer coupling RF amplifier 104 to the rest of the circuit is implemented using electromagnetic or balun transformer 122 instead of DC isolated transformer 110. In some embodiments, using an electromagnetic type transformer instead of a magnetic transformer may result in a more compact circuit, especially for RF signals with having a larger bandwidth. In some embodiments, transformer 122 may be implemented using two transformers in a Guanella topology as shown. Alternatively, other electromagnetic transformer types or topologies may be such as, but not limited to a Ruthroff topology may be used. In some embodiments, electromagnetic transformer 122 may be implemented using twisted-pair cables, or parallel lines on a magnetic core.

Because transformer 122 does not provide DC isolation between RF amplifier 104 and speaker coil 106, DC coupling capacitors 132 and 128 are placed in series with transformer 122 in order to provide DC isolation for RF amplifier 104. The center tap of transformer 122 may be grounded via capacitor 130. In alternative embodiments of the present invention, the center tap of transformer 122 may be left open and capacitor 130 may be omitted.

Figure 3:
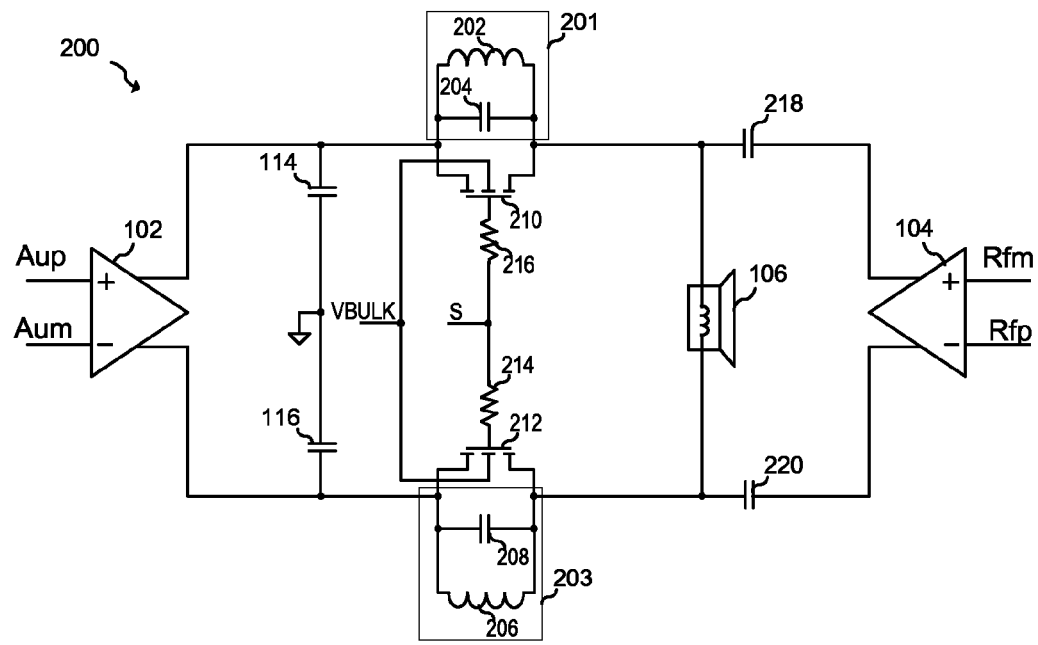
FIG. 3 illustrates a schematic of an embodiment system in which an audio amplifier is coupled to a loudspeaker parallel via resonant circuits having bypass switches.

Embodiment system 200 shown in FIG. 3 may be used when audio amplifier 102 and RF amplifier 104 are configured to transmit at separate times and not simultaneously. In system 200, RF amplifier 104 is coupled in parallel to speaker coil 106 via AC coupling capacitors 218 and 220. Audio amplifier 102 is coupled to speaker coil 106 via parallel resonant circuit 201 having inductor 202 and capacitor 204, and parallel resonant circuit 203 having inductor 206 and capacitor 208. Capacitors 204 and 208 may be due to the parasitic capacitances of transistors 210 and 212, due to additional capacitance coupled between the drains and sources of transistors 210 and 212, or a combination thereof. In an embodiment, the parallel resonant frequency of parallel resonant circuits 201 and 203 corresponds to a RF output frequency generated by RF amplifier 104. For example, if the RF transmission frequency generated by amplifier 104 is 13 MHz, then the first and second parallel resonant circuits may be configured to have a parallel resonant frequency at about 13 MHz. The parallel resonance of parallel resonant circuits 201 and 203 provide a high impedance to RF amplifier 104 at the RF transmission frequency. It should be appreciated that system 200 is may be used when audio amplifier 102 is configured to provide a differential output signal. In single ended embodiments, however the parallel resonant circuit 203 may be omitted.

In an embodiment, parallel resonant circuit 201 is bypassed by transistor 210, and parallel resonant circuit 203 is bypassed by transistor 212. Transistors 210 and 212 may be activated via signal S when audio amplifier 102 is activated and RF amplifier 104 is deactivated. When transistors 210 and 212 are activated, parallel resonant circuits 201 and 203 are bypassed with a low impedance, thereby allowing for efficient operation of audio amplifier 102 driving speaker coil 106. On the other hand, when transistors 210 and 212 are deactivated, parallel resonant circuits 201 and 203 provide a high impedance to RF amplifier 104 at the RF frequency.

In embodiment, the off state capacitance of transistors 210 and 212 are compensated by inductors 202 and 206 respectively, when tuned in parallel resonance to the RF transmission frequency. As such, a large RF impedance is presented to the speaker coil 106 when switching transistors 210 and 212 are in an off state. Furthermore, the effect of the large gate capacitances of transistors 210 and 212 may be reduced by adding high ohmic resistors 214 and 216 in series with the gates of transistors 210 and 212, respectively. Resistors 214 and 216 reduce the effects of gate source and gate drain capacitance seen on the source and drain of transistors 210 and 212. Bulk control pin VBULK may be coupled to the most positive or most negative voltage generated output of amplifier 102 to avoid clamping of the audio signal depending on the type of switching transistors used. Because transistors 210 and 212 present a low series impedance to audio amplifier 102 at audio frequencies, for example in the mΩ range, inductors 202 and 206 may be implemented using physically small high ohmic inductors. In alternative embodiments of the present invention, transistors 210 and 212 may be omitted.

Figure 4:
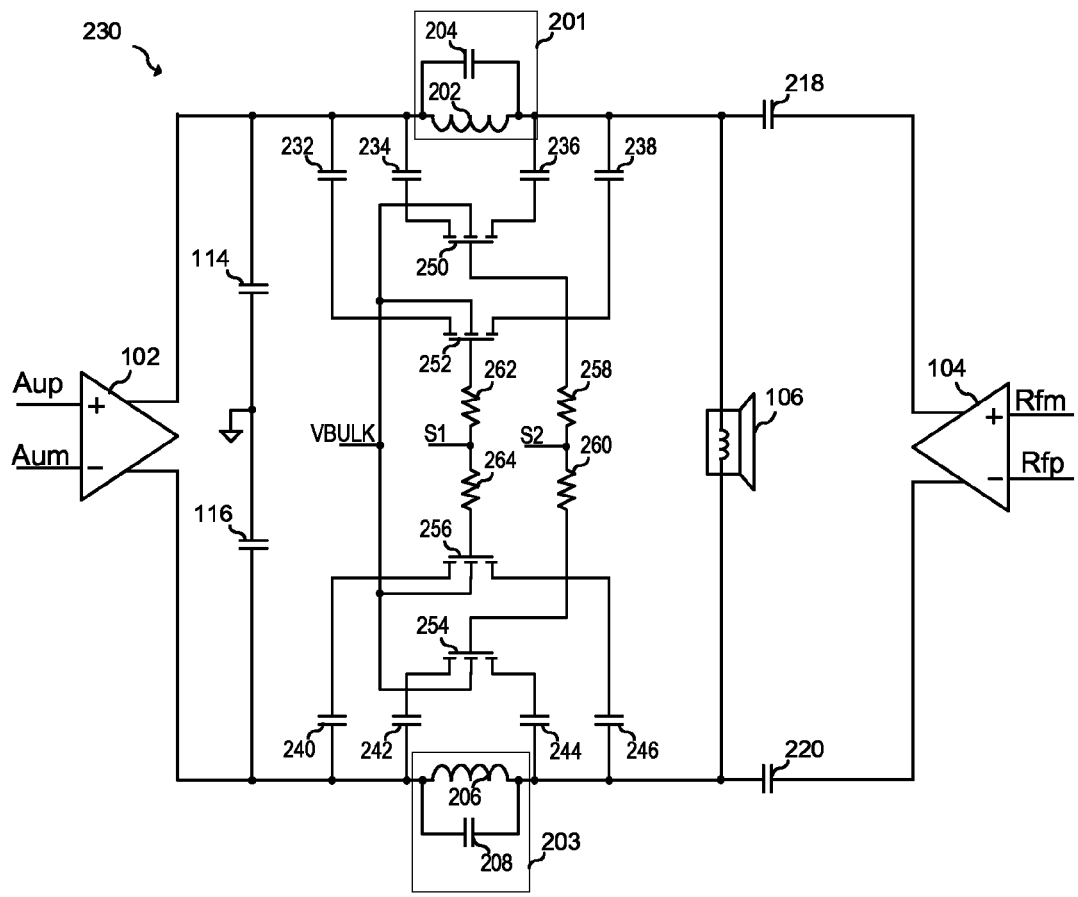
FIG. 4 illustrates a schematic of an embodiment system in which an audio amplifier is coupled to a loudspeaker via tunable parallel resonant circuits.

FIG. 4 illustrates embodiment system 230 in which the resonant frequency of parallel resonant circuit 201 may be tuned using switching transistors 250 and 252, and capacitors 232, 234, 236 and 238. Similarly, the parallel resonant frequency of parallel resonant circuit 203 may be tuned using switching transistors 254, 256, capacitors 240, 242, 244, and 246. Switching transistors 252 and 256 are driven by signal S1 via resistors 262 and 264, and switching transistors 250 and 254 are driven by signal S2 via resistors 258 and 260. Resistors 258, 260, 262, and 264 reduce the effects of the gate capacitance of transistors 250, 252, 254 and 256 on their respective outputs.

The frequency of parallel resonant circuit 201 may be reduced by activating switch 252, which places a series combination of capacitors 232 and 238 in parallel with parallel resonant circuit 201. This parallel resonant frequency may be further lowered by activating switch 250, which places a series combination of capacitors 204 and 206 in parallel with parallel resonant circuit 201. The effect of turning on switches 254 and 256 has a similar effect on the parallel resonant frequency of parallel resonant circuit 203. Similarly, when switches 250, 252, 254 and 256 are open, the parallel resonant frequency of parallel resonant circuits 201 and 203 may be increased. While only two switching transistors are shown for each parallel resonant circuit 201 and 203, any number of switches coupled in series with capacitors may be used together to adjust the parallel resonant frequency of parallel resonant circuits 201 and 203. As such, fine control over the parallel resonant frequency of parallel resonant circuits 201 and 203 may be achieved through the appropriate selection of switches and capacitors.

In some embodiments of the present invention, switches 250, 252, 254 and 256, as well as capacitors 232, 234, 236, 238, 240, 242, 244 and 246 may be implemented on a single integrated circuit. Transistors 250, 252, 254, and 256 may be implemented using transistors having a low capacitance and high linearity.

System 230 may be further used to dynamically tune the center frequency of parallel resonant circuits 201 and 203. For example, the impedance of speaker coil 106 may change as system 230 comes within close proximity to conductive objects such as metallic objects, water, and living objects. By tuning the parallel resonance of parallel resonant circuits 201 and 203 in response to environmental changes, high-performance may be maintained. In some embodiments, the impedance of speaker coil 106 is sensed using a second coil in close proximity with speaker coil 106 in a transmit mode, or the capacitance of the parallel resonant circuit is tuned for a best signal-to-noise ratio in a receive mode. Tuning may also be used to accommodate systems in which RF amplifier 104 is configured to transmit at different RF transmission frequencies.

In some embodiments, additional bypass switching transistors may be added to bypass parallel resonant circuits 201 in 203 in the same manner that switches 210 and 212 bypass parallel resonant circuits in system 200 of FIG. 3. As such, the bulk node is biased at a voltage that is either greater than the highest output voltage produced by amplifier 102 or at a voltage that is less than the most negative voltage generated by amplifier 102. In embodiments that do not include these switches, signal excursions at the output of amplifier 102 that exceed bulk bias voltages may be tolerated because transistors 250, 252, 254 and 256 are not DC coupled to the switching transistors.

Figure 5:
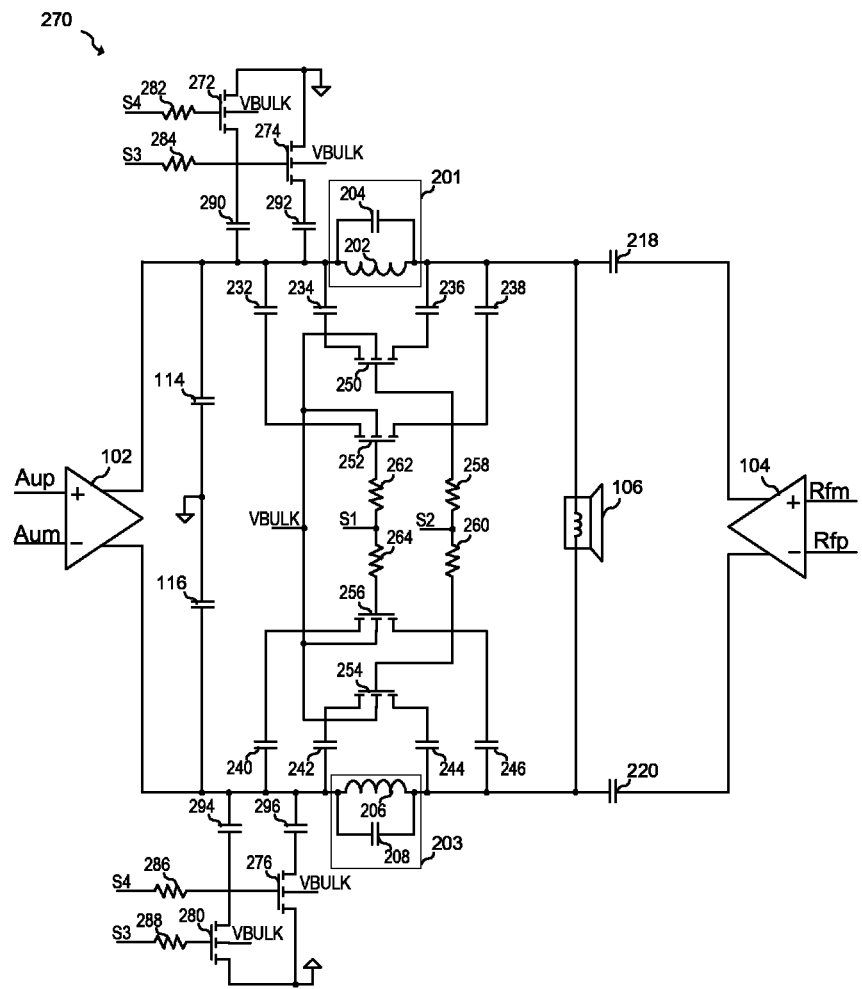
FIG. 5 illustrates a schematic of a further embodiment system in which an audio amplifier is coupled to a loudspeaker via tunable parallel resonant circuits.

FIG. 5 illustrates system 270 according to a further embodiment. System 270 is similar to system 230 of FIG. 4 with the addition of additional tuning networks coupled to the output of audio amplifier 102. These additional tuning networks may be used to further fine-tune the system. Alternatively, additional tuning networks may also be coupled to speaker coil 106.

Switching transistors 272, 274, 276, and 280 may be coupled to the output of audio amplifier 102 via capacitors 290, 292, 296 and 294, respectively. Series resistors 282, 284, 286, and 288 are coupled in series with the gates of switching transistors 272, 274, 276 and 280, respectively, to reduce the effects of gate capacitance on the capacitance seen at the output of audio amplifier 102. It should be appreciated, that more switched capacitor units may be coupled in parallel with the additional tuning networks to provide further fine-tuning of the capacitance and/or the series resonant frequency seen by speaker coil 106.

In some embodiments, control terminals S1, S2, S3 and S4 may be controlled remotely based on system feedback or a received signal level at a remote terminal. In other embodiments, an oscillator (not shown) may be used to test the system in order to determine the state of control terminals S1, S2, S3 and S4.

Switching transistors 250, 252, 254, 256, 272, 274, 276 and 208 may be implemented using MOS transistors or transistors of another transistor type, such as integrated gate bipolar transistors (IGBTs). In some embodiments, commercially available switching transistor components, such as PGS22 switches may be used. Embodiment systems may be implemented, for example on an integrated circuit, in one or more integrated circuits mounted within a hybrid package, or be implemented using a variety of components on a laminate circuit. In some embodiments, speaker coil 106 is coupled to the remaining circuit components via a speaker port. The speaker port may include terminals configured to accept speaker coil 106.

In accordance with an embodiment, a system has an audio amplifier configured to be coupled to a speaker coil port via a parallel resonant circuit, and a RF amplifier configured to transmit a RF signal at the first RF transmission frequency. The speaker coil port is configured to be coupled to a speaker coil, and the parallel resonant circuit has a resonance frequency of about the first radio frequency (RF) transmission frequency. In some case, the system may further include the speaker coil.

In an embodiment, the parallel resonant circuit includes a first transformer coupled in series with the audio amplifier and the speaker coil port, such that the RF amplifier is coupled to the speaker coil port via the first transformer. The first transformer may include a first winding coupled between the audio amplifier and the speaker coil port, and a second winding coupled to the RF amplifier. In further embodiments, the first transformer includes a balun having a first port coupled between the audio amplifier and the speaker coil port, and a second port coupled to the RF amplifier. This balun may be implemented using, for example, a Guanella balun.

In some embodiments, the RF amplifier is coupled in parallel with the speaker coil port. In one example, the RF amplifier is coupled to the speaker coil port via coupling capacitors. The system may further include a bypass switch coupled in parallel with the parallel resonant circuit, such that the bypass switch is configured to be closed when the audio amplifier is active, and configured to be open when the audio amplifier is inactive. In such cases, the parallel resonant circuit may include an inductor coupled in series with the bypass switch, and a parasitic capacitance of the bypass switch may provide at least a portion of a capacitance of the parallel resonant circuit. A MOS transistor, or other type of transistor, may be used to implement the bypass switch. In some embodiments, a resistor is coupled in series with a gate of the MOS transistor. In a further embodiment, the resonance frequency of the parallel resonant circuit is tunable.

In accordance with a further embodiment, a circuit includes an audio amplifier configured to be coupled to a speaker coil port via an output port of a transformer coupled in series with the audio amplifier, and a RF amplifier configured to transmit a RF signal coupled to an input port of the transformer. The speaker coil port may be configured to be coupled to a speaker coil. In some embodiment, the circuit may also include the speaker coil.

In an embodiment, the input port of the transformer includes a first winding, and the output port of the transformer includes a second winding. Furthermore, a capacitance may be coupled in parallel with the second winding, such that the second winding and the capacitance form a parallel resonant network having a center frequency. The RF amplifier may be configured to transmit at a RF transmission frequency at about the center frequency.

In accordance with a further embodiment, a circuit includes a RF amplifier coupled in parallel with a speaker coil port that is configured to be coupled to a speaker coil. An adjustable parallel resonant circuit having a first port is coupled the speaker coil port, and an audio amplifier is coupled to a second port of the adjustable parallel resonant circuit. In some circuits, the speaker coil is also included. A bypass switch may be further coupled across the parallel resonant circuit, such that the bypass switch is configured to be closed when the audio amplifier is active and configured to be open when the RF amplifier is active.

In an embodiment, the adjustable parallel resonant circuit includes a first parallel resonant circuit coupled between a first terminal of the audio amplifier and a first terminal of the speaker coil port, and a second parallel resonant circuit coupled between a second terminal of the audio amplifier and a second terminal of the speaker coil port. In some cases, the adjustable parallel resonance circuit includes an adjustable capacitor and a fixed inductor. For example, the adjustable capacitor may be implemented using at least one switchable capacitor coupled to the fixed inductor. This switchable capacitor may be a capacitor coupled in series with a MOS switch.

In accordance with a further embodiment, a method of operating a speaker coil coupled in parallel with a RF amplifier and coupled to an audio amplifier via an adjustable parallel resonant circuit includes operating the speaker coil in an audio mode, and operating the speaker mode in a RF mode. The audio mode includes activating the audio amplifier and deactivating the RF amplifier. Operating the speaker coil in the audio mode may further include bypassing the adjustable parallel resonant circuit. The RF mode, on the other hand, includes transmitting a RF signal with the RF amplifier, such that the RF signal has a frequency near a resonance frequency of the adjustable parallel resonant circuit.

In an embodiment, the method may further include adjusting a capacitance coupled to an inductor of the adjustable parallel resonant circuit. Adjusting the capacitance may include activating a switching network coupled to at least one terminal of the inductor, the switching network comprising a switching transistor coupled in series with at least one capacitor.

Advantages of embodiment systems include the ability to couple an audio power amplifier and a radio frequency (RF) power amplifier to an electromagnetic loudspeaker, while maintaining a high power efficiency of the system. A further advantage includes the ability to provide good signal isolation to the audio power amplifier and the RF amplifier while also providing low insertion loss for both audio and RF signals.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system comprising:
   an audio amplifier configured to be coupled to a speaker coil port via a parallel resonant circuit, the parallel resonant circuit having a resonance frequency of about a first radio frequency (RF) transmission frequency, wherein the speaker coil port is configured to be coupled to a speaker coil; and
   a RF amplifier configured to transmit a RF signal at the first RF transmission frequency.

2. The system of claim 1, further comprising the speaker coil.

3. The system of claim 1, wherein:
   the parallel resonant circuit comprises a first transformer coupled in series with the audio amplifier and the speaker coil port; and
   the RF amplifier is coupled to the speaker coil port via the first transformer.

4. The system of claim 3, wherein the first transformer comprises:
   a first winding coupled between the audio amplifier and the speaker coil port; and
   a second winding coupled to the RF amplifier.

5. The system of claim 3, wherein the first transformer comprises a balun having a first port coupled between the audio amplifier and the speaker coil port, and a second port coupled to the RF amplifier.

6. The system of claim 5, wherein the balun comprises a Guanella balun.

7. The system of claim 1, wherein the RF amplifier is coupled in parallel with the speaker coil port.

8. The system of claim 7, wherein the RF amplifier is coupled to the speaker coil port via coupling capacitors.

9. The system of claim 7, further comprising a bypass switch coupled in parallel with the parallel resonant circuit, the bypass switch configured to be closed when the audio amplifier is active, and configured to be open when the audio amplifier is inactive.

10. The system of claim 9, wherein:
    the parallel resonant circuit comprises an inductor coupled in series with the bypass switch; and
    a parasitic capacitance of the bypass switch provides at least a portion of a capacitance of the parallel resonant circuit.

11. The system of claim 9, wherein the bypass switch comprises a MOS transistor.

12. The system of claim 11, further comprising a resistor coupled in series with a gate of the MOS transistor.

13. The system of claim 7, wherein the resonance frequency of the parallel resonant circuit is tunable.

14. A circuit comprising:
an audio amplifier configured to be coupled to a speaker coil port via an output port of a transformer coupled in series with the audio amplifier, wherein the speaker coil port is configured to be coupled to a speaker coil; and
a RF amplifier configured to transmit a RF signal coupled to an input port of the transformer.

15. The circuit of claim 14, further comprising the speaker coil.

16. The circuit of claim 14, wherein:
the input port of the transformer comprises a first winding; and
the output port of the transformer comprises a second winding.

17. The circuit of claim 16, further comprising a capacitance coupled in parallel with the second winding, wherein the second winding and the capacitance form a parallel resonant network having a center frequency; and
the RF amplifier is configured to transmit at a RF transmission frequency at about the center frequency.

18. A circuit comprising:
a RF amplifier coupled in parallel with a speaker coil port, the speaker coil port configured to be coupled to a speaker coil;
an adjustable parallel resonant circuit having a first port coupled the speaker coil port;
an audio amplifier coupled to a second port of the adjustable parallel resonant circuit.

19. The circuit of claim 18, further comprising the speaker coil.

20. The circuit of claim 18, further comprising a bypass switch coupled across the parallel resonant circuit, the bypass switch configured to be closed when the audio amplifier is active and configured to be open when the RF amplifier is active.

21. The circuit of claim 18, wherein the adjustable parallel resonant circuit comprises:
a first parallel resonant circuit coupled between a first terminal of the audio amplifier and a first terminal of the speaker coil port; and
a second parallel resonant circuit coupled between a second terminal of the audio amplifier and a second terminal of the speaker coil port.

22. The circuit of claim 18, wherein the adjustable parallel resonance circuit comprises an adjustable capacitor and a fixed inductor.

23. The circuit of claim 22, wherein the adjustable capacitor comprises at least one switchable capacitor coupled to the fixed inductor.

24. The circuit of claim 23, wherein the switchable capacitor comprises a capacitor coupled in series with an MOS switch.

25. A method of operating a speaker coil coupled in parallel with a RF amplifier and coupled to an audio amplifier via an adjustable parallel resonant circuit, the method comprising:
operating the speaker coil in an audio mode comprising activating the audio amplifier and deactivating the RF amplifier; and
operating the speaker coil in a RF mode comprising transmitting a RF signal with the RF amplifier, the RF signal having a frequency near a resonance frequency of the adjustable parallel resonant circuit.

26. The method of claim 25, wherein operating the speaker coil in the audio mode comprises bypassing the adjustable parallel resonant circuit.

27. The method of claim 25, further comprising adjusting a capacitance coupled to an inductor of the adjustable parallel resonant circuit.

28. The method of claim 27, further wherein adjusting the capacitance comprises activating a switching network coupled to at least one terminal of the inductor, the switching network comprising a switching transistor coupled in series with at least one capacitor.

* * * * *